(12) United States Patent

Onishi (10) Patent No.: US 9,647,679 B1
(45) Date of Patent: *May 9, 2017

(54) METHODS AND APPARATUS FOR A DELTA SIGMA ADC WITH PARALLEL-CONNECTED INTEGRATORS

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/408,890

(22) Filed: Jan. 18, 2017

Related U.S. Application Data

(63) Continuation of application No. 15/181,942, filed on Jun. 14, 2016.

(51) Int. Cl.
*H03M 1/00* (2006.01)
*H03M 3/00* (2006.01)
*H04R 19/04* (2006.01)

(52) U.S. Cl.
CPC ........... *H03M 3/368* (2013.01); *H03M 3/422* (2013.01); *H03M 3/464* (2013.01); *H04R 19/04* (2013.01); *H04R 2201/003* (2013.01)

(58) Field of Classification Search
CPC ...... H03M 3/368; H03M 3/422; H03M 3/464; H04R 19/04
USPC ............................................... 341/122–155
See application file for complete search history.

(56) References Cited

U.S. PATENT DOCUMENTS

| 5,596,609 | A | * | 1/1997 | Genrich | ............. H03H 17/0671 |
| | | | | | 375/350 |
| 5,793,316 | A | * | 8/1998 | Noguchi | ............. H03M 7/3013 |
| | | | | | 341/141 |
| 5,870,048 | A | | 2/1999 | Kuo et al. | |
| 6,313,774 | B1 | | 11/2001 | Zarubinsky et al. | |
| 6,515,607 | B2 | | 2/2003 | Liu et al. | |
| 6,577,091 | B2 | | 6/2003 | Yabe et al. | |
| 6,608,575 | B2 | | 8/2003 | Bazarjani | |
| 7,236,113 | B1 | * | 6/2007 | Wang | ........................ G01D 5/24 |
| | | | | | 324/548 |
| 7,250,886 | B1 | | 7/2007 | Killat et al. | |

(Continued)

FOREIGN PATENT DOCUMENTS

JP 2011097269 5/2011
JP 2012060250 3/2012

(Continued)

*Primary Examiner* — Lam T Mai
(74) *Attorney, Agent, or Firm* — The Noblitt Group, PLLC (57) ABSTRACT

Various embodiments of the present technology may comprise a method and device for a delta-sigma ADC. The method and device may comprise receiving an input signal to at least two parallel-connected first-stage integrators and corresponding feedback DACs, and simultaneously integrating the input signal by each of the first-stage integrators. The method and device may further comprise a second stage integrator connected in series with the first-stage integrators, a quantizer, and digital to analog converters, coupled between the output of the quantizer and the inputs of the first-stage integrators.

20 Claims, 12 Drawing Sheets

(56) References Cited

U.S. PATENT DOCUMENTS

| | | |
|---|---|---|
| 7,289,054 B1 | 10/2007 | Watanabe |
| 9,419,642 B1 | 8/2016 | Nguyen |
| 2002/0118128 A1 | 8/2002 | Siferd |
| 2002/0140589 A1 | 10/2002 | Bazarjani |
| 2002/0180629 A1 | 12/2002 | Liu |
| 2005/0253746 A1* | 11/2005 | Hirano ................. H03M 3/414 341/143 |
| 2006/0119491 A1 | 6/2006 | Gealow |
| 2008/0143567 A1* | 6/2008 | Vadipour ............. H03M 3/446 341/143 |
| 2010/0085230 A1 | 4/2010 | Son |
| 2014/0015700 A1 | 1/2014 | Oishi |
| 2014/0113575 A1 | 4/2014 | Mitani et al. |
| 2016/0261277 A1 | 9/2016 | Wang et al. |

FOREIGN PATENT DOCUMENTS

| | | |
|---|---|---|
| JP | 2012186715 | 9/2012 |
| JP | 2014086892 | 5/2014 |

\* cited by examiner

METHODS AND APPARATUS FOR A DELTA SIGMA ADC WITH PARALLEL-CONNECTED INTEGRATORS

CROSS-REFERENCE TO RELATED APPLICATION

This application is a continuation of U.S. patent application Ser. No. 15/181,942, filed on Jun. 14, 2016, and incorporates the disclosure of the application in its entirety by reference.

BACKGROUND OF THE TECHNOLOGY

Analog to digital converters (ADCs) are utilized in a variety of electronic devices and systems to transform an analog signal to a digital signal. One ADC architecture commonly used is the delta-sigma ADC. The differentiating aspects of the delta-sigma ADCs include the use of oversampling in conjunction with decimation filtering and quantization noise shaping. Advantageous characteristics of the delta-sigma ADC include high resolution and high stability. Due to these characteristics, delta-sigma ADCs are frequently chosen for use in audio systems, such as hearing devices, microphones, and the like.

Due to the low operating voltage of many devices which employ the delta-sigma ADCs, however, the signal-to-noise ratio (SNR) performance and dynamic range can be greatly diminished. The dynamic range of a system may be described as the range of amplitudes between a noise component of the system and the onset of clipping (the level at which the power supply is no longer adequate to provide larger waveforms), while the SNR may be described as the ratio of a signal component (at some arbitrary level) to a noise component.

Many audio applications require enhanced SNR performance and dynamic range while maintaining particular design specifications, such as the operating voltage and the oversampling ratio. Other considerations involve the cost of manufacturing the ADCs, as an increase in the chip area increases the total cost of the ADC.

To improve the SNR of the delta-sigma ADC, the noise within the system must be reduced and/or the signal must be increased. Noise that is commonly associated with delta-sigma ADCs employing switched capacitor type integrators is kT/C noise, where k, T and C represent the Boltzmann constant, absolute temperature, and capacitance value, respectively. This noise describes the total thermal noise power added to a signal when a sample is taken on a capacitor. One way to reduce this noise is to increase the capacitance. Since the capacitance of a capacitor may be approximated with the equation $C = \in A/d$ (where C is the capacitance in Farads, $\in$ is the permittivity of the dielectric, A is the area of plate overlap in square meters, and d is the distance between the plates in meters), the capacitance may be increased by increasing the area A. Increasing the capacitance using this method, however, results in a larger time constant, causing slower switching operation.

Operational amplifiers ("op-amps"), which are commonly employed in delta-sigma ADCs, are also responsible for generating noise, such as flicker noise (also referred to as "1/f noise") and thermal noise. Reducing the noise generated by the op-amp may further improve the SNR of the delta-sigma ADC. Meeting the required specifications of the system, however, such as a specified oversampling ratio and operating voltage, while achieving high performance in the op-amp is difficult, at least in part because all frequency bands may be necessary for the sampling system (such as in a switched capacitor configuration). Further, reducing the op-amp noise by conventional methods leads to transistors that occupy very large areas on the IC, which increases the current and power consumption considerably.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various semiconductor devices, such as transistors, capacitors, and the like, which may carry out a variety of functions. In addition, the present technology may be practiced in conjunction with any number of electronic systems and the apparatus described is merely one exemplary application for the technology. Further, the present technology may employ any number of conventional techniques for signal sampling, signal filtering, signal quantization, and the like.

Figure 1:
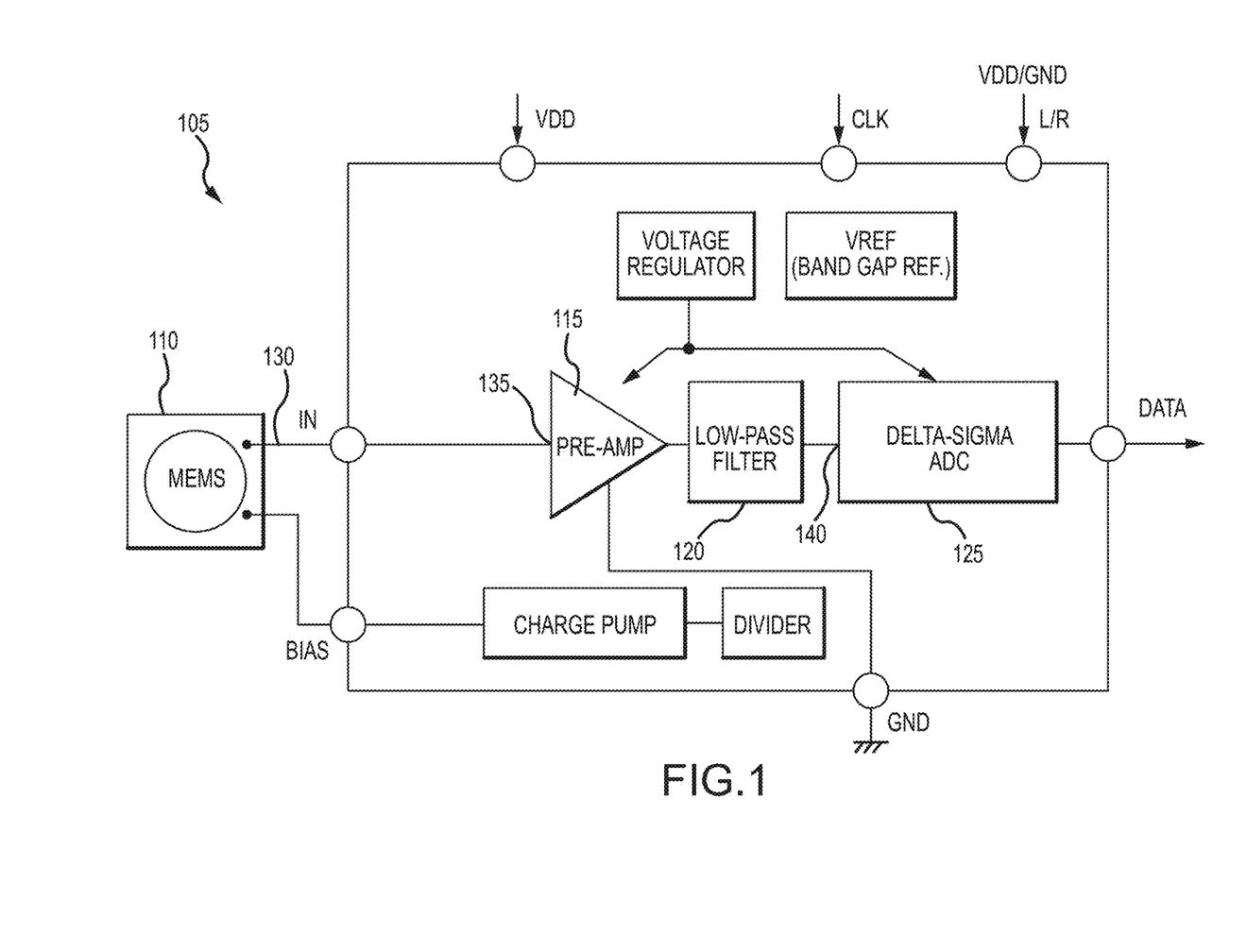
FIG. 1 representatively illustrates a system in accordance with an exemplary embodiment of the present technology.

Methods and apparatus for a delta-sigma ADC according to various aspects of the present technology may operate in conjunction with any suitable electronic system, such as an audio system, a microphone system, a video telephone, an acoustics system, hearing devices, and the like. Referring to FIG. 1, an electronic device according to various aspects of the present technology may comprise an audio system, in this case a digital microelectrical-mechanical system (MEMS) microphone integrated chip 105. The system may comprise a MEMS device 110, a pre-amplifier 115, a first filter 120, and a delta-sigma ADC 125.

In various embodiments, the MEMS device 110 may convert sound into an electrical signal, for example with the use of a pressure-sensitive diaphragm. The MEMS device 110 may be fabricated using conventional MEMS processing techniques. An output 130 of the MEMS device 110 may be coupled to an input terminal 140 of the delta sigma ADC 125 via the pre-amplifier 115 and the first filter 120. In various embodiments, the first filter 120 may comprise a low-pass filter to filter out signals above a predetermined frequency and prevent aliasing. The pre-amplifier 115 and the first filter 120 may be fabricated with any conventional semiconductor materials and techniques.

In various embodiments, the IC 105 may be coupled to or include a clock generator or other timing circuit (not shown) for producing a timing signal CLK. The timing signal CLK may be transmitted to an input of the IC 105. The clock generator may produce a symmetrical square wave or other suitable waveforms. In one embodiment, the clock generator may produce two-phase, non-overlapping timing signals. In an alternative embodiment, the clock generator may produce a four-phase, non-overlapping timing signals, which may provide increased performance. In various embodiments, the clock generator may be formed from a resonant circuit and an amplifier. The clock generator may be formed on the same chip as the IC 105 or on a companion chip.

Figure 2:
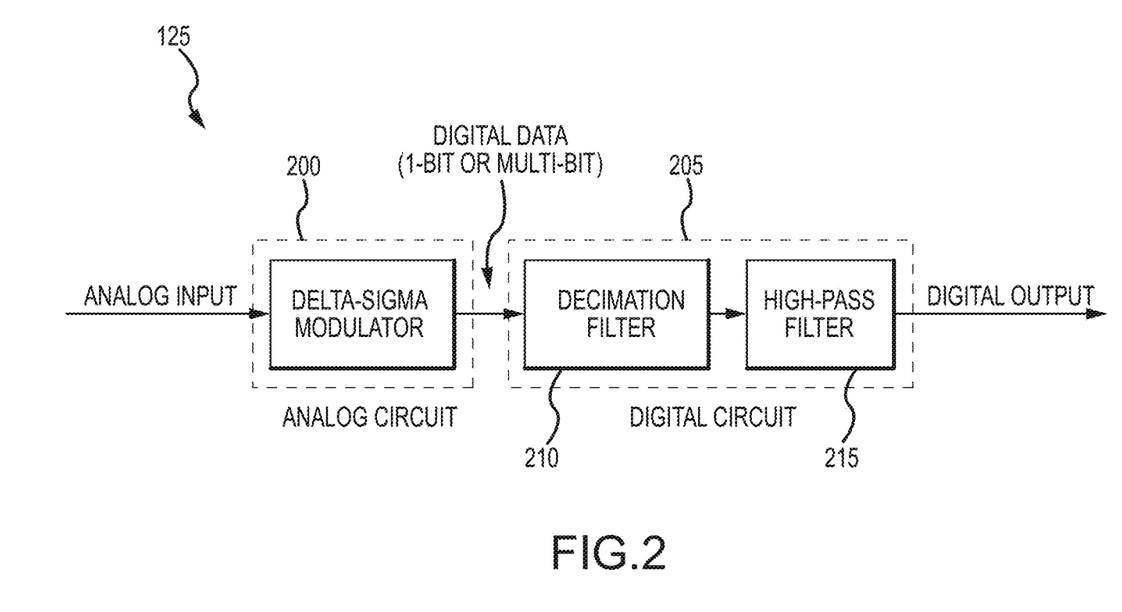
FIG. 2 representatively illustrates a block diagram of a delta-sigma ADC in accordance with an exemplary embodiment of the present technology.

Referring to FIG. 2, in an exemplary embodiment, the delta-sigma ADC 125 may comprise a delta-sigma modulator 200 and a digital circuit 205 for converting an analog signal into a digital signal. The digital circuit 205 may comprise a decimation filter 210 and a second filter 215. In various embodiments, the second filter 215 may comprise a high-pass filter for filtering out signals below a predetermined frequency. The digital circuit 205 may be formed on the same chip as the IC 105 or on a companion chip.

Figure 3:
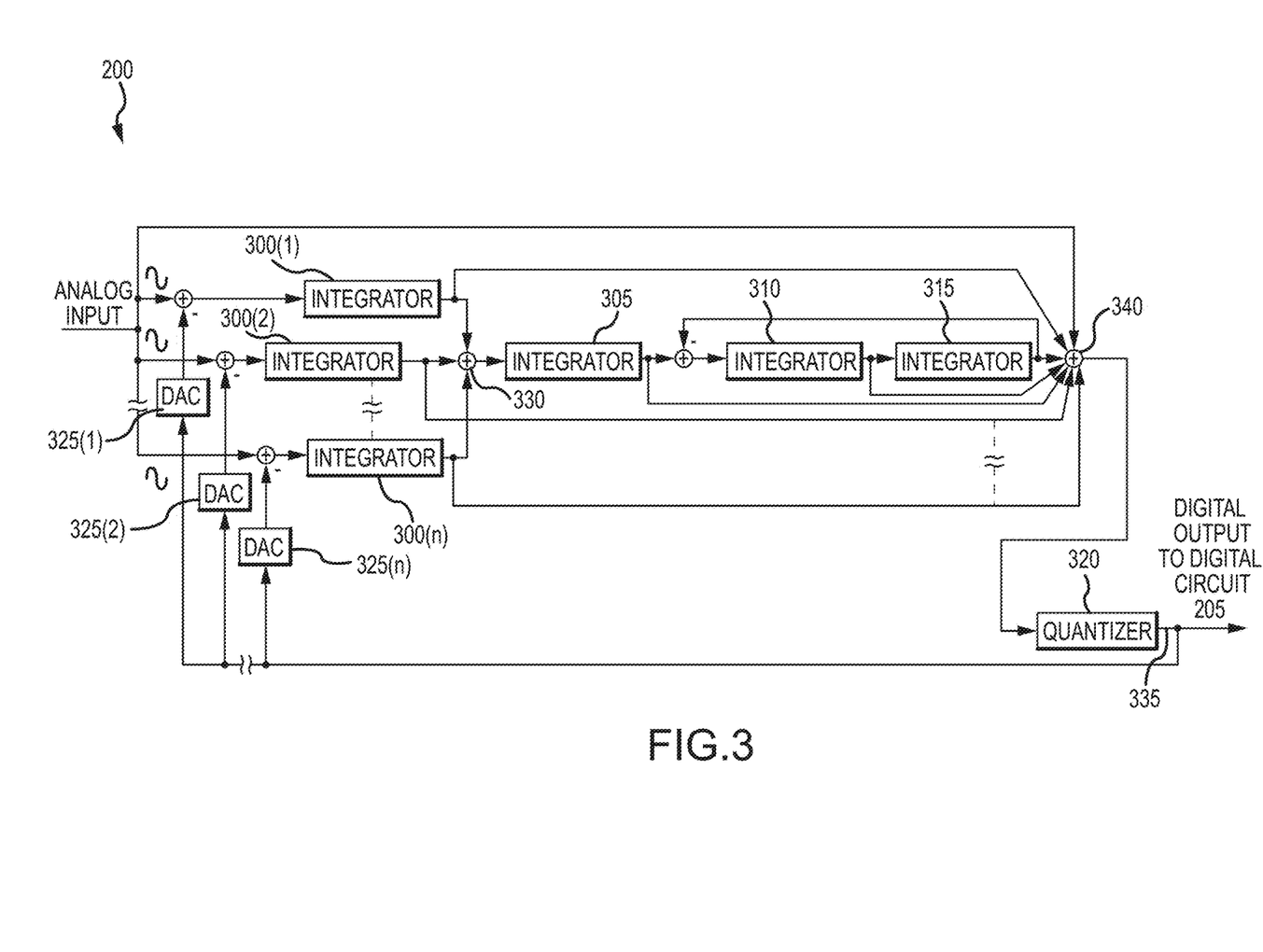
FIG. 3 representatively illustrates a block diagram of a delta-sigma modulator in accordance with an exemplary embodiment of the present technology.

Referring to FIG. 3, in various embodiments, the delta-sigma modulator 200 may comprise a plurality of first-stage integrators 300. The plurality of first-stage integrators 300 may be connected in parallel with an input signal. In various embodiments, the integrators 300 simultaneously integrate the input signal and produce an output signal. The output signals of each first-state integrator 300 may then be used as the input to a second-stage integrator 305. The second-stage integrator 305 may be connected in series with the parallel-connected first-stage integrators 300. In various embodiments, the delta-sigma modulator 200 comprises an addition function 330, such as a summer circuit where the outputs of the first-stage integrators 305 are summed.

In various embodiments, a third-stage and a fourth stage integrator 310, 315 may be connected in series with the second-stage integrator 305. An output generated by the second-stage integrator 305 may be used as an input to the third-stage integrator 310, and an output generated by the third-stage integrator 310 may be used as an input to the fourth-stage integrator 315.

In various embodiments, the analog input and the output of each integrator may be connected to a combination unit 340, such as a summer circuit. The combination unit may produce an output which represents the sum of the outputs and the analog input. The output of combination unit 340 may be connected to an input of a quantizer 320.

In various embodiments, the delta-sigma modulator 200 may comprise local feedback from the output of the fourth-stage integrator 315 to the input of the third-stage integrator 310 to optimize the quantization noise. In various embodiments, a coefficient, implemented as capacitors, may be inserted in each integrator and/or the combination unit 340 to stabilize the delta-sigma modulator 200. The coefficients may be selected for a particular design or to achieve a particular performance specification.

In various embodiments, the delta-sigma modulator 200 may further comprise a quantizer 320. The quantizer 320 may be connected in series with the last integrator in the series chain via the combination unit 340. An output terminal 335 of the quantizer 320 may be connected to an input of the digital circuit 205. In various embodiments, the quantizer may output a single-bit value, while other embodiments may output a multi-bit value.

The output terminal 335 of the quantizer 320 may also be coupled to the first-stage integrators 300 via one or more feedback digital to analog converters (DAC) 325. In an exemplary embodiment, each first-stage integrator 300 is connected to a dedicated feedback DAC 325. For example, a first first-stage integrator 300(1) is coupled to a first feedback DAC 325(1), the second first-stage integrator 300(2) is coupled to a second feedback DAC 325(2), and the nth first-stage integrator 300(n) is coupled to an nth feedback DAC 325(n). The feedback DAC may comprise a single-bit DAC or a multi-bit DAC. For example, if the quantizer 320 outputs a multi-bit value, then the feedback DAC may be matched to the bit value of the quantizer 320.

Figure 10:
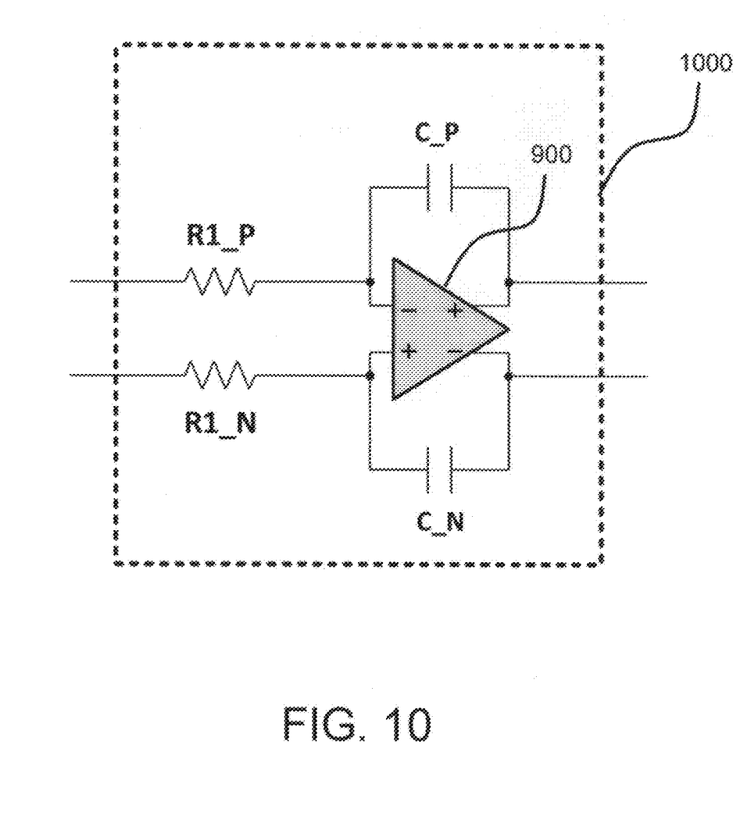
FIG. 10 representatively illustrates an integrator circuit in accordance with an exemplary embodiment of the present technology.

In various embodiments, the delta-sigma modulators may be arranged in various configurations according to a particular application. For example, the delta-sigma modulator 200 may comprise a feed-forward configuration, a feed-back configuration, or a cascaded configuration. Additionally, the delta-sigma modulator 200 may be implemented as a continuous-time or a discrete-time modulator. For example, continuous-time modulators may be implemented with RC integrators 1000 (FIG. 10) and expressed in the S-domain (i.e. 1/s), and discrete-time modulators may be implemented with switched-capacitor integrators and expressed in the Z-domain. The topology may be selected according to design choices for a particular application. For example, continuous-time systems may produce less noise at a given power than discrete-time systems. Continuous-time systems, however, may suffer from limited sample-rate range and may be susceptible to out-of-band signals. Additionally, a feed-forward configuration may impose timing constraints for high-speed multi-bit modulators. Further, the order of the delta-sigma modulator may be selected according to desired noise-shaping characteristics.

Figure 4:
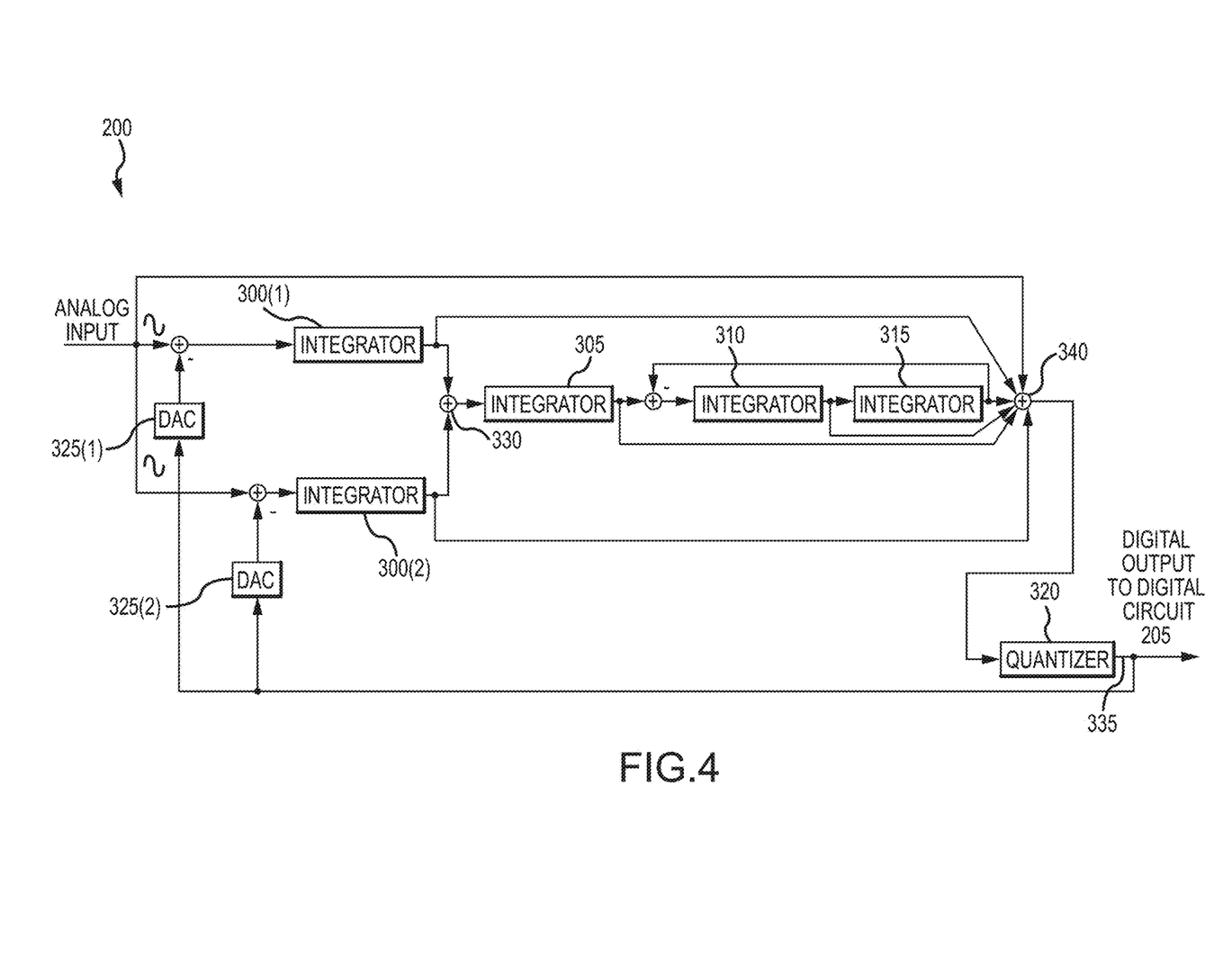
FIG. 4 representatively illustrates a block diagram of a delta-sigma modulator in accordance with an exemplary embodiment of the present technology.

Referring to FIG. 4, in an exemplary embodiment of a fourth-order delta-sigma modulator 200 arranged in a feed-forward configuration, the delta-sigma modulator 200 comprises two first-stage integrators connected in parallel with the input signal. The delta-sigma modulator 200 further comprises the second-stage, third-stage, and fourth-stage integrators 305, 310, 315 connected in series, and the quantizer 320 connected in series with the fourth-stage integrator 315 via the combination unit 340. The delta-sigma modulator 200 may comprise local feedback from the output of the fourth-stage integrator 315 to the input of the third-stage integrator 310 to optimize the quantization noise. The output terminal 335 of the quantizer 320 may be coupled to each of the first-stage integrators 300(1), 300(2) via the feedback DACs 325(1), 325(2), respectively. The coefficients of each integrator and the combination unit 340 may be selected according to conventional or other appropriate criteria.

Figure 5:
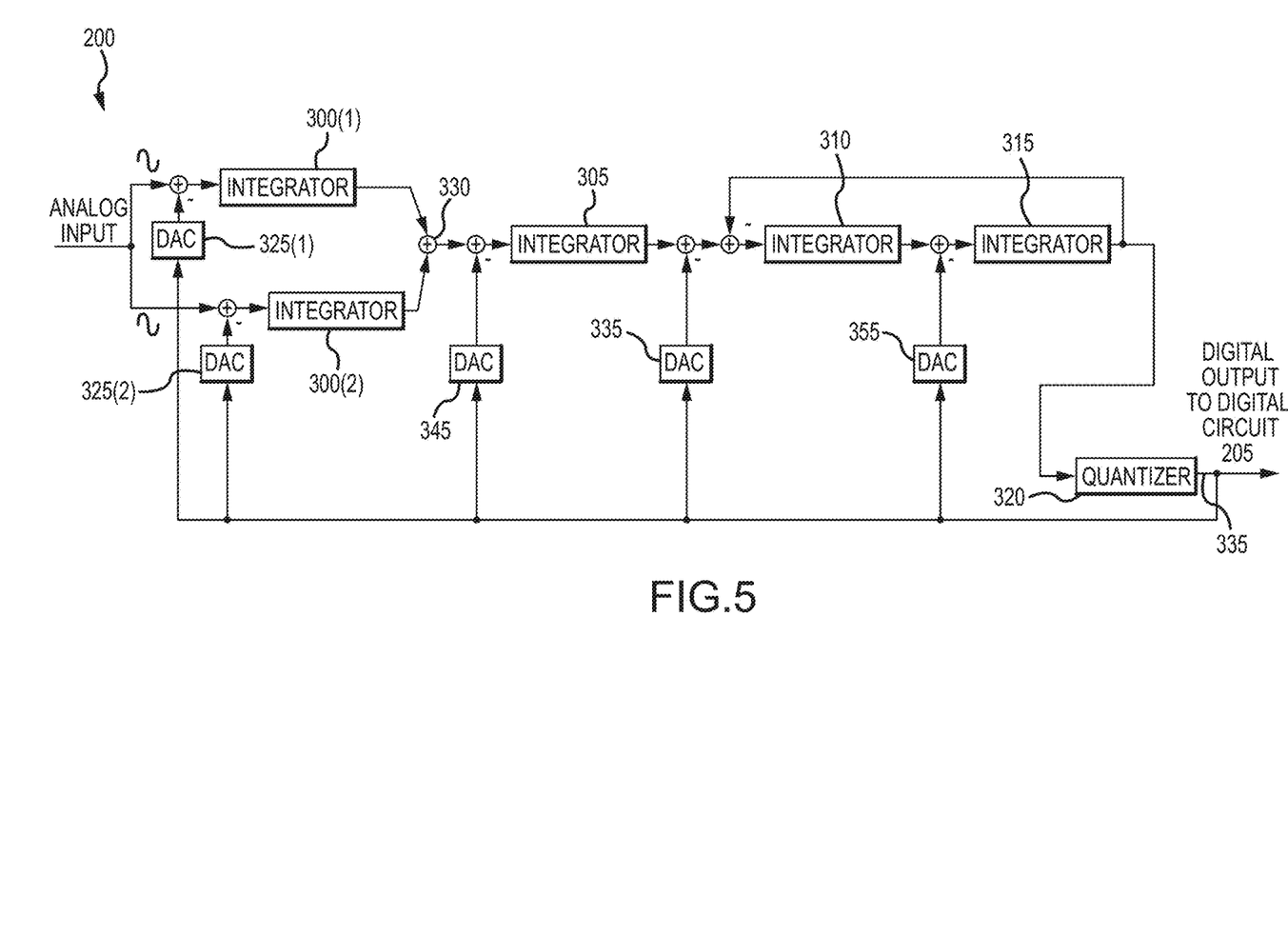
FIG. 5 representatively illustrates a block diagram of a delta-sigma modulator in accordance with exemplary embodiments of the present technology.

Referring to FIG. 5, in an embodiment of a fourth-order delta-sigma modulator 200 arranged in a feedback configuration, the delta-sigma modulator 200 comprises two first-stage integrators 300 connected in parallel with the input signal. The delta-sigma modulator 200 further comprises the second-stage, third-stage, and fourth-stage integrators 305, 310, 315 connected in series, and the quantizer 320 connected in series with the fourth-stage integrator 315.

The delta-sigma modulator 200 may comprise local feedback from the output of the fourth-stage integrator 315 to the input of the third-stage integrator 310 to optimize the quantization noise. The output terminal 335 of the quantizer 320 may be coupled to each of the first-stage integrators 300(1), 300(2) via the feedback DACs 325(1), 325(2), respectively. In the current embodiment, the delta-sigma modulator 200 may further comprise additional feedback DACs 345 335, 355, each one coupled to the second-stage, third-stage, and fourth stage integrators, respectively. For the sake of brevity, the coefficients of each integrator are not described in detail here.

Figure 6:
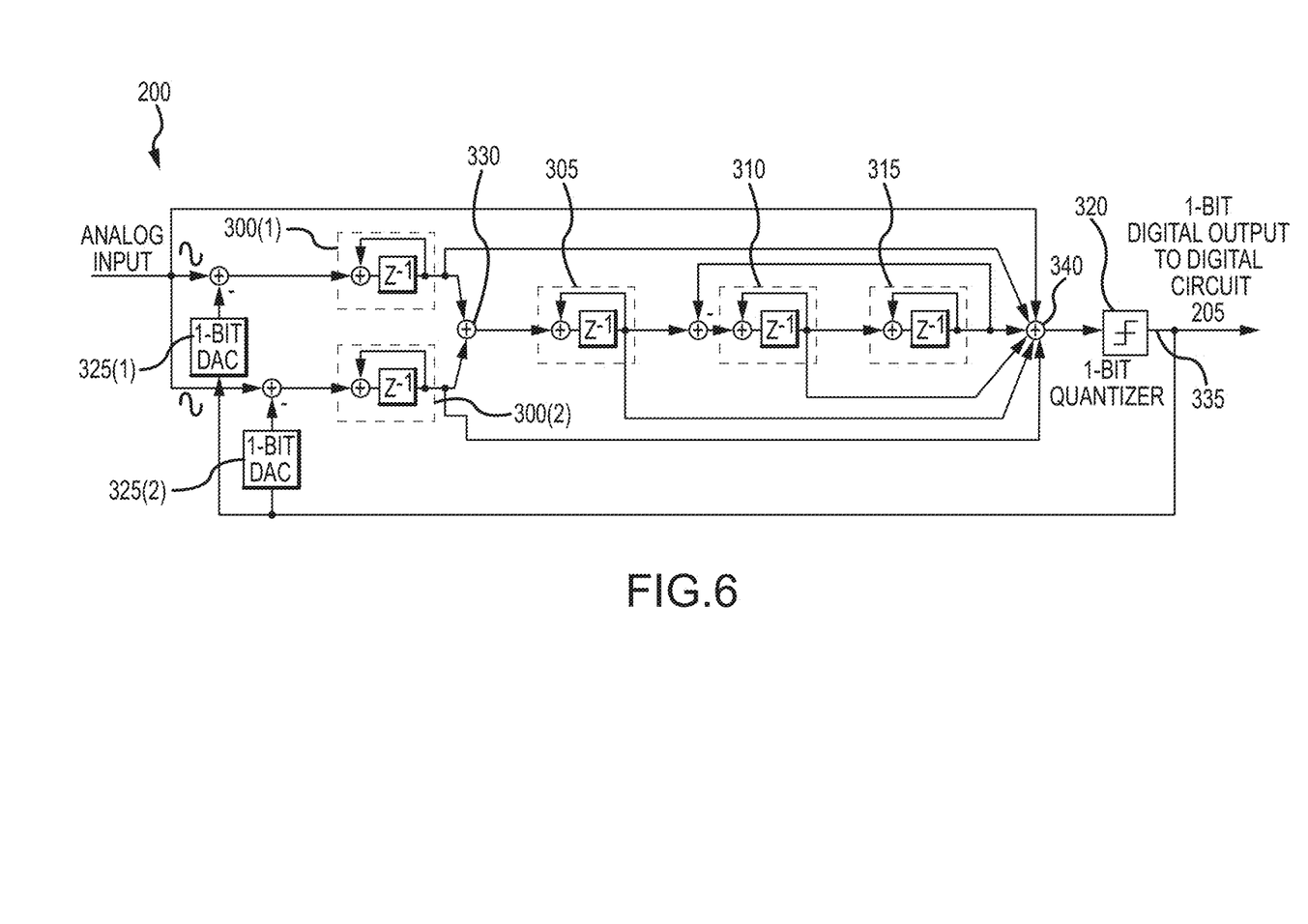
FIG. 6 representatively illustrates a block diagram of a delta-sigma modulator in accordance with an exemplary embodiment of the present technology.

Referring to FIG. 6, in an exemplary embodiment of a fourth-order, discrete-time delta-sigma modulator 200 arranged in a feed-forward configuration, the delta-sigma modulator 200 comprises two first-stage integrators 300 connected in parallel with the input signal. The delta-sigma modulator 200 further comprises the second-stage, third-stage, and fourth-stage integrators 305, 310, 315 connected in series, and the quantizer 320 connected in series with the fourth-stage integrator 315 via the combination unit 340. In the present embodiment, the integrators 300, 305, 310, 315 are expressed in the Z-domain where the output of the integrator may be expressed as $z^{-1}/(1-z^{-1})$.

Figure 7:
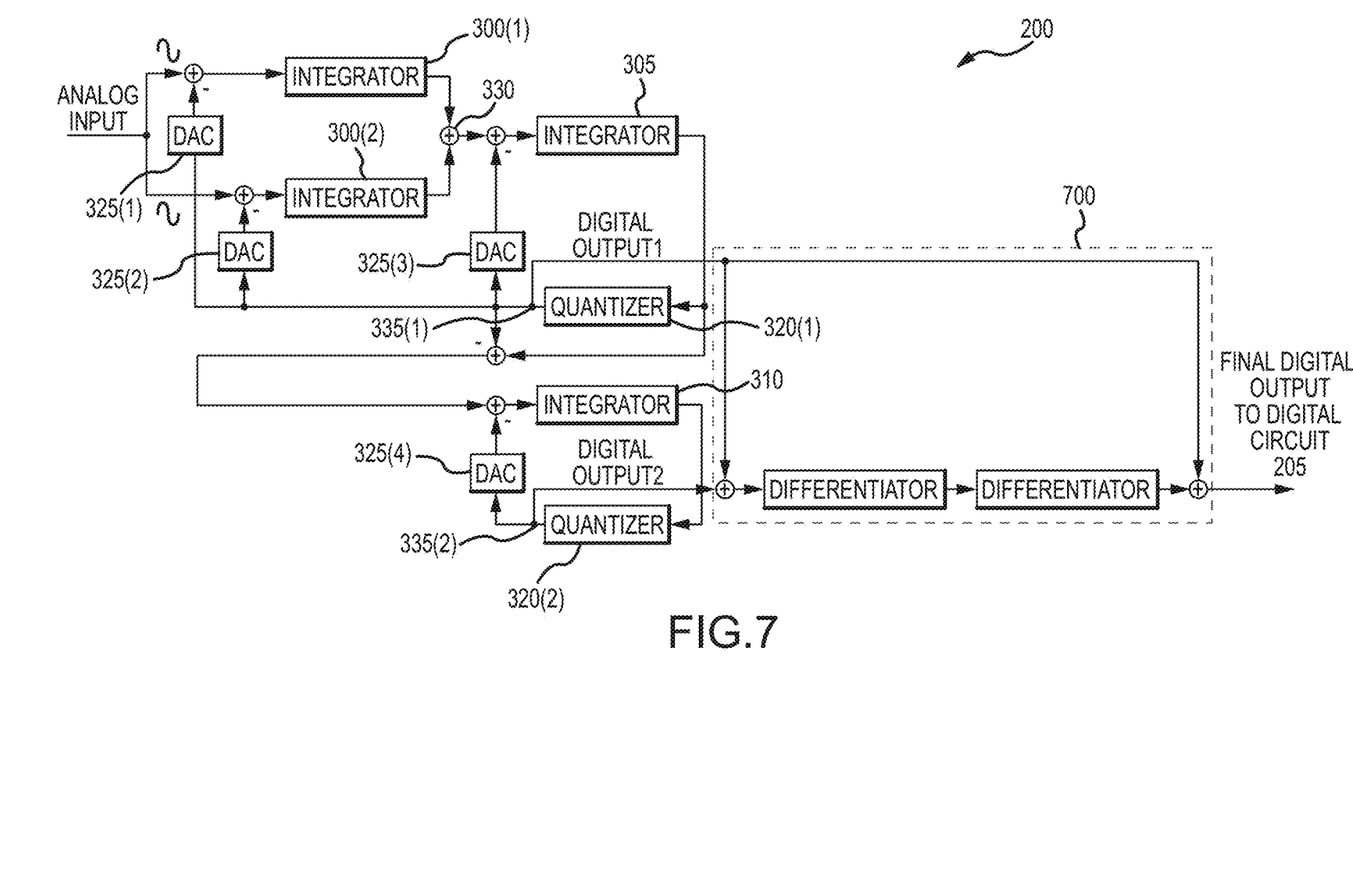
FIG. 7 representatively illustrates a block diagram of a delta-sigma modulator in accordance with an exemplary embodiment of the present technology.

Referring to FIG. 7, in an exemplary embodiment of a third order delta-sigma modulator 200 arranged in the cascade configuration, the delta-sigma modulator 200 comprises two first-stage integrators 300 connected in parallel with the input signal. The delta-sigma modulator 200 further comprises the second-stage and third-stage integrators 305, 310 connected in series.

The delta-sigma modulator 200 with the cascade configuration may comprise a plurality of quantizers 320(1), 320(2). Each quantizer 320(1), 320(2) may receive a signal from one of the second-stage integrator 305 or the third-stage integrator 310. The output terminal 335(1) of the quantizer 320(1) may be coupled to the first-stage integrators 300(1), 300(2) via the feedback DACs 325(1), 325(2), respectively. Furthermore, the output terminal 335(1) of the quantizer 320(1) may be coupled to the second-stage integrator 305 via the feedback DAC 325(3). The output terminal 335(2) of the quantizer 320(2) may be coupled to the third-stage integrator 310 via the feedback DAC 325(4). The outputs 335(1), 335(2) of the quantizers 320(1), 320(2) may then be transmitted to a digital signal processor 700 for further processing prior to transmission to the digital circuit 205. For the sake of brevity, the coefficients of each integrator and the digital signal processor 700 are not described in detail here.

Figure 8A:
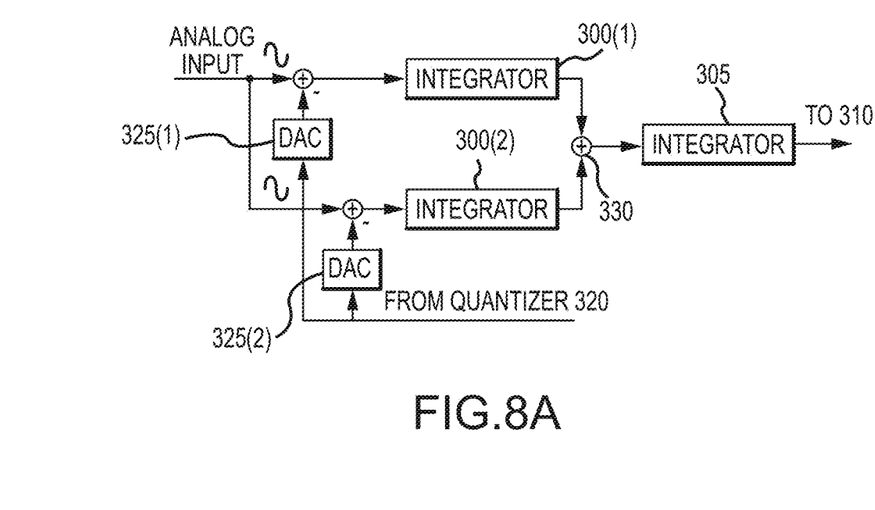
FIGS. 8A-C representatively illustrate a partial circuit schematic of a delta-sigma modulator in accordance with an exemplary embodiment of the present technology.
Figure 8B:
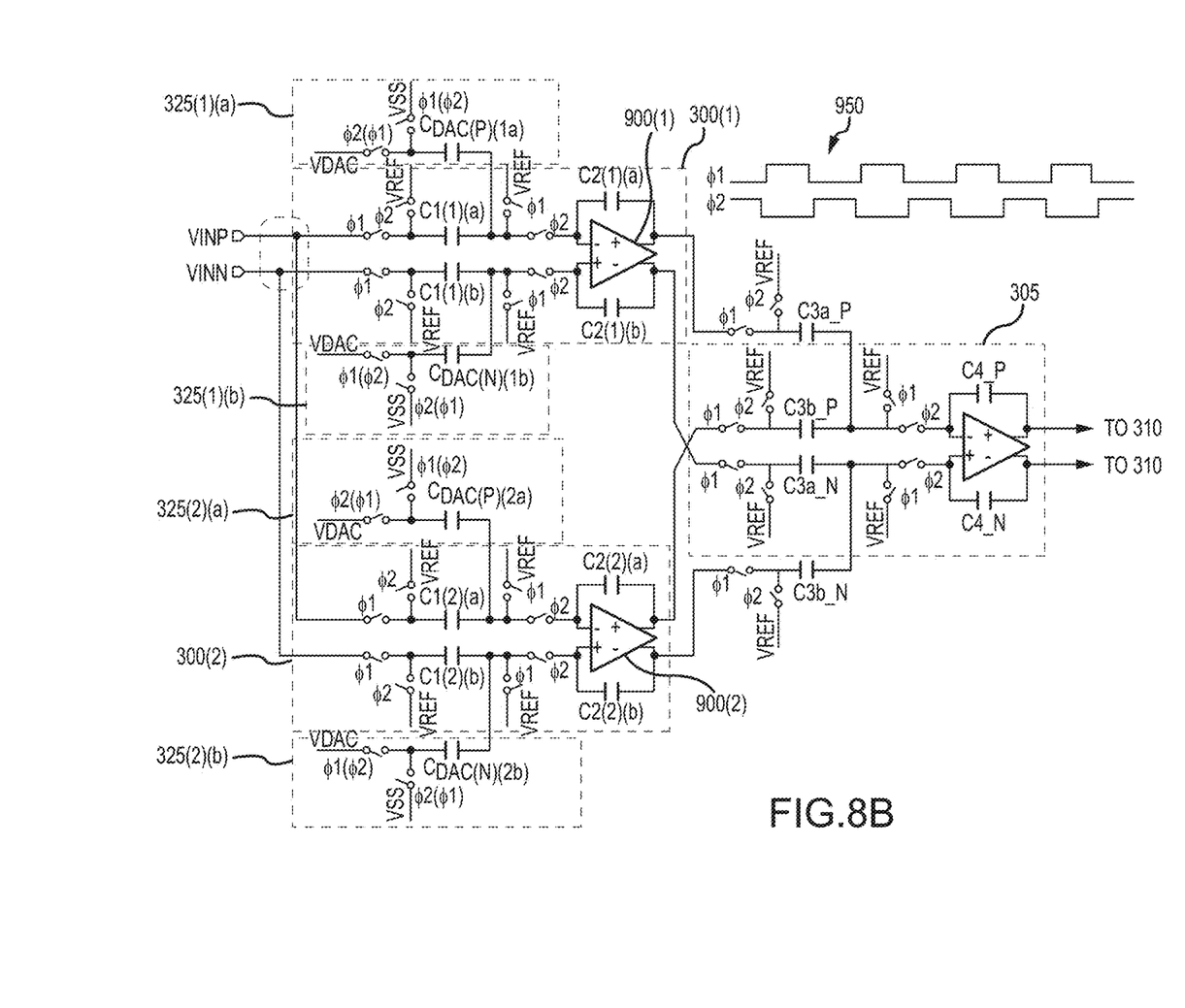

Referring to FIGS. 8A-8B, in an exemplary embodiment, each of the first-stage integrators 300(1), 300(2) may comprise fully differential switched capacitor type integrators having two output terminals supplying differential voltages symmetrical to a common-mode voltage. The first-stage integrators 300(1), 300(2) may be connected to positive and negative input voltages $Vin_P$, $Vin_N$ to form a positive-phase integrator or a negative-phase integrator. In the present embodiment, both first-stage integrators 300(1), 300(2) are configured as positive-phase integrators.

Figure 8C:
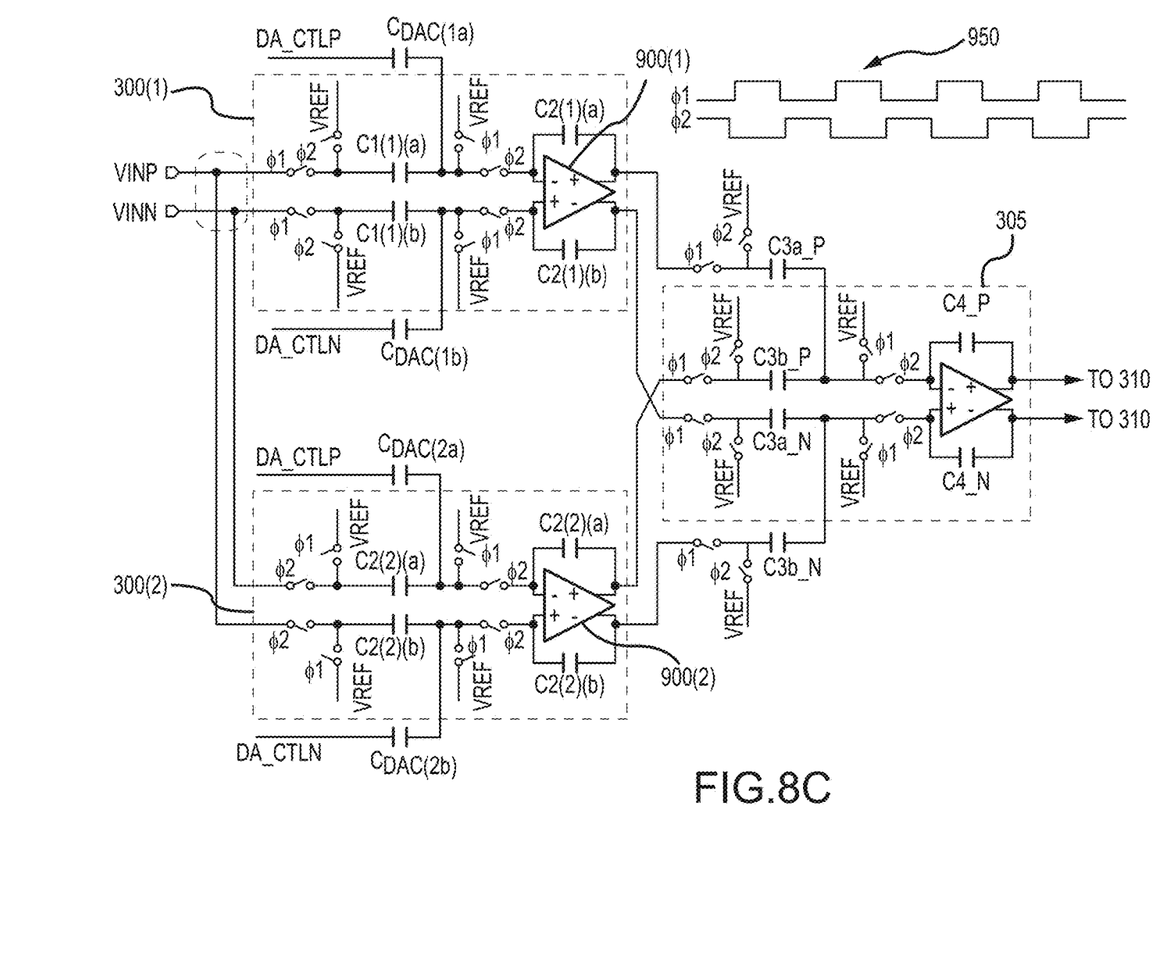

Referring to FIG. 8C, in an alternative embodiment, the first first-stage integrator 300(1) may be configured as a positive-phase integrator while the second first-stage integrator 300(2) may be configured as a negative-phase integrator. In the present embodiment, the positive terminal of the op-amp of the second first-stage integrator 300(2) is connected to the positive input $Vin_P$, while the negative terminal of the op-amp is connected to the negative input $Vin_N$. The positive-phase integrator and negative-phase integrator may appropriately be chosen according to a characteristic of the pre-amplifier 115 (FIG. 1) or the requirement specification of the system 105 (FIG. 1).

In various embodiments, the second-stage integrator 305 may also comprise a fully differential switched capacitor type integrator. In various embodiments, the second-stage integrator 305 may further implement the addition function 330.

Figure 9:
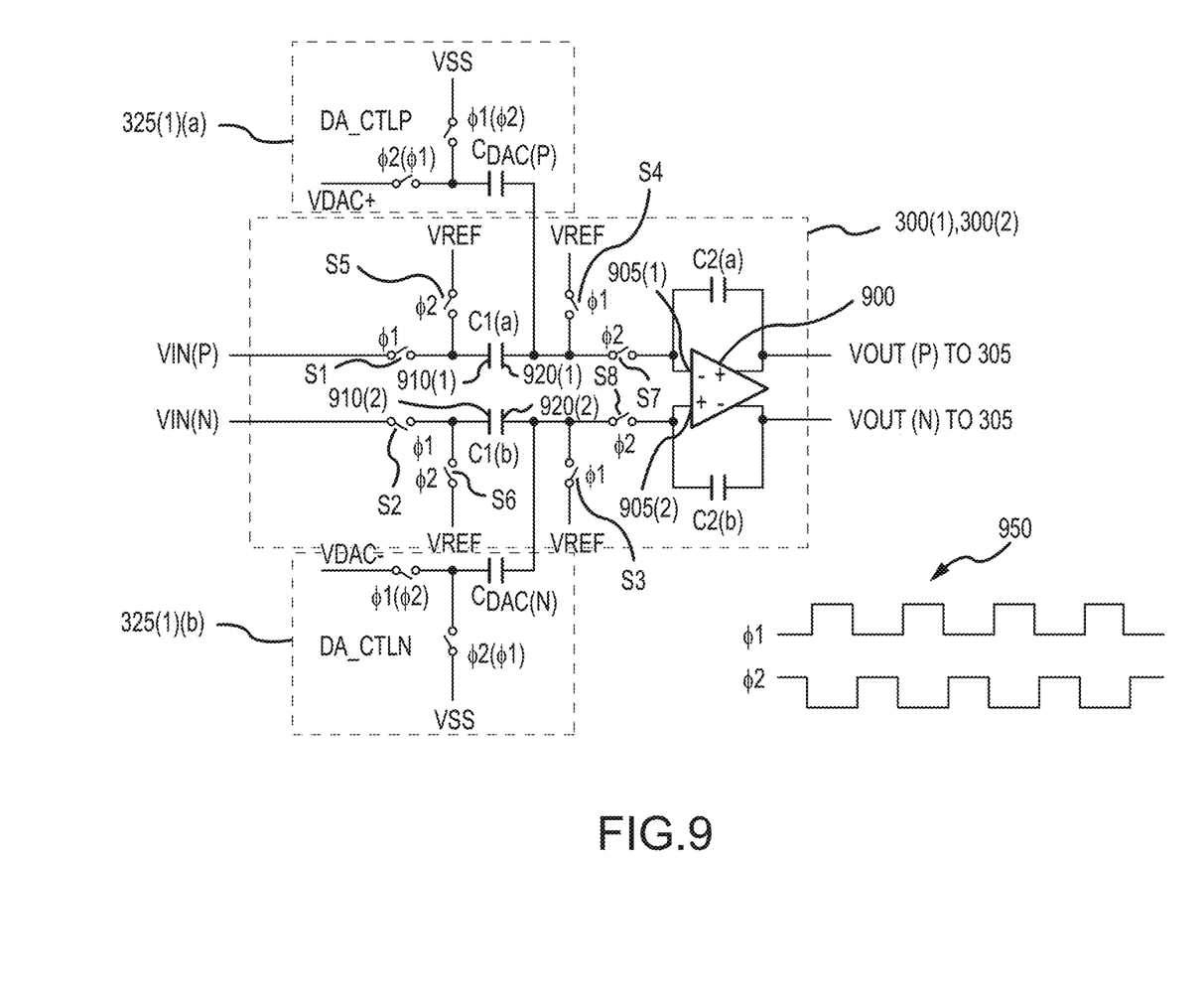
FIG. 9 representatively illustrates an integrator circuit in accordance with an exemplary embodiment of the present technology.

Referring to FIG. 9, in various embodiments, the integrator 300 may comprise an operational amplifier ("op-amp") 900, a plurality of switching devices S1:S8, first and second sampling capacitors C1(a), C1(b), and first and second integration capacitors C2(a), C2(b). The integrator 300 may be formed utilizing any suitable technology and/or fabrication methods, such as CMOS technology.

In various embodiments, the sampling capacitors C1(a), C1(b) may have the same capacitance value. Similarly, the integration capacitors C2(a), C2(b) may have the same capacitance value. The capacitance ratio of the first sampling capacitor C1(a) and the first integration capacitor C2(a) (i.e., C1(a)/C2(a)) may be represented as an integration coefficient. For example, the integration coefficient may be set to a value less than 1 to stabilize the modulator 200. Similarly, the capacitance ratio of the second sampling capacitor C1(b) and the second integration capacitor C2(b) (i.e. C1(b)/C2(b)) may be represented as an integration coefficient. These integration coefficients may be designed to have the same value.

In various embodiments, the switching devices S1:S8 may comprise transistors and may receive a control signal provided by the clock generator.

First plates 910(1), 910(2) of each of the sampling capacitors C1(a), C1(b) may be selectively coupled to the input terminals $Vin_{(P)}$, $Vin_{(N)}$ via the switching devices S1, S2, and second plates 920(1), 920(2) of each of the sampling capacitors C1(a), C1(b) may be selectively coupled to the op-amp 900 via the switching devices S7, S8.

Each integration capacitor C2(a), C2(b) may be coupled between an output terminal $Vout_{(P)}$, $Vout_{(N)}$ of the op-amp 900 and an input terminal 905(1), 905(2). For example, the first integration capacitor C2(a) may be coupled between the positive output terminal $Vout_{(P)}$ and the negative input terminal 905(1), while the second integration capacitor C2(b) may be coupled between the negative output terminal $Vout_{(N)}$ and the positive input terminal 905(2).

A reference voltage Vref may also be selectively coupled to the op-amp input terminals 905(1), 905(2) via switching devices S4, S3.

In various embodiments, the feedback DAC 325 may receive a signal DA_CTL from the quantizer 320 (FIG. 3). The feedback DAC 325 may be represented as a positive DAC receiving a signal DA_CTLP, and a negative DAC receiving a signal DA_CTLN. The feedback DAC 325 may comprise switching devices and a capacitor $C_{DAC}$. At least one switching device couples to a voltage $V_{DAC}$. A positive voltage $V_{DAC+}$ is associated with the signal DA_CTLP and a negative voltage $V_{DAC-}$ is associated with the signal DA_CTLN. The voltage $V_{DAC}$ is selected based on the output of the quantizer 320. For example, the positive voltage $V_{DAC+}$ is selected by controlling the switching devices if the feedback DAC 325 receives the positive signal DA_CTLP; conversely, the negative voltage $V_{DAC-}$ is selected by controlling the switching devices if the feedback DAC 325 receives the negative signal DA_CTLN.

Referring back to FIGS. 8B-8C, in various embodiments, the op-amp 900(1) of the first first-stage integrator 300(1) may be substantially equal in size and topology to the op-amp 900(2) of the second first-stage integrator 300(2). In various embodiments, the sampling capacitors C1(1)(a), C1(1)(b) of the first first-stage integrator 300(1) may have substantially equal capacitance values to the sampling capacitors C1(2)(a), C1(2)(b) of the second first-stage integrator 300(2). In various embodiments, the number and size of the switching devices of the first first-stage integrator 300(1) may be substantially equal to the number and size of switching devices of the second first-stage integrator 300(2).

Similarly, in various embodiments, the capacitors of the feedback DACs 325(1), 325(2) may be substantially equal in number and capacitance value. The switching devices of the feedback DACs 325(1), 325(2) may be substantially equal in number and size.

Connecting the integrators in parallel, resulting in an equivalent capacitance $C_{eq}$, may increase the total capacitance associated with the first-stage integrators 300. For N first-stage integrators 300, an equivalent capacitance $C_{eq}$ may be calculated with the following equation:

$$C_{eq} = \sum_{i=1}^{N} C_i$$

Using this topology, the switching operation is not diminished since the total capacitance of the first-stage integrators may be increased by utilizing capacitors with a smaller area A. The capacitance of the parallel-connected feedback DACs 325 may also be calculated with the same equation.

Thus, by arranging the first-stage integrators 300 in parallel and arranging the feedback DACs 325 in parallel, the signal component increases by N times while the noise component increases by the square root of N, where N represents the number of parallel-coupled integrators and feedback DACs, respectively. Therefore, the SNR of the delta-sigma modulator 200 improves by a factor of N/(square root of N). The SNR may also be represented in decibels (dB), where the SNR improves by $10 \times \log_{10}(N)$ dB. For example, if two (2) first-stage integrators 300 are connected in parallel with the input signal Vin and two (2) feedback DACs 325 are connected in parallel, N is equal to 2. In this case, the signal component increases by 2 times (i.e. 6 dB) and the noise component only increases by the square root of 2 (i.e. 3 dB). Therefore, the SNR improves by 3 dB. This arrangement does not require an increase in the operating voltage of the IC 105, and can be produced with minimum circuit modification and accelerated development time. In addition, the size of the IC 105 is also not greatly increased, thereby keeping fabrication costs low. Meanwhile, the system is able to achieve a wide dynamic range since the noise component is only minimally increased.

In operation, referring again to FIG. 9, the input signal is applied between the input terminals $Vin_{(P)}$, $Vin_{(N)}$. In various embodiments, the timing signals 950, for example produced by a clock generator, may be two-phase, non-overlapping timing signals. In alternative embodiments, however, four-phase timing signals may be utilized for higher performance.

In an embodiment utilizing the two-phase timing, during a first phase ϕ1, the switching devices S1:S4 are closed (i.e. on) allowing sampling of the differential input voltage on the first plates 910(1), 910(2) of the each of the sampling capacitors C1(a), C1(b). The switching devices S5:S8 are open (i.e. off) holding second plates 920(1), 920(2) at the reference voltage Vref level. During the first phase ϕ1, since the switching devices S7, S8 are open, the op-amp 900 is isolated from the sampling capacitors C1(a), C1(b), and the op-amp output remains constant at a previously integrated value.

During a second phase ϕ2, the first plates 910(1), 910(2) of the sampling capacitors C1(a), C1(b) experience a differential potential shift while the second plates 920(1), 920(2) are coupled to the op-amp 900 via switching devices S7, S8. This shift causes the op-amp 900 to transfer a charge to the integration capacitors C2(a), C2(b), causing the output voltage to shift. The output voltage may be transmitted to the second-stage integrator 305 where the signal is integrated again.

In various embodiments, the output voltage may also be transmitted to the quantizer 320 (FIG. 3). For example, in the fourth-order delta-sigma modulators, the output voltage of the second-stage integrator 305 may be used as inputs of the third-stage integrator 310 as well as transmitted to an input of the quantizer 320. Similarly, the output voltage of the third-stage integrator 310 may be used as inputs of the fourth-stage integrator 314 as well as transmitted to an input of the quantizer 320.

In embodiments utilizing the discrete-time modulator 200 (FIG. 6), operation may be synchronized with the timing signals 950. For example, the operation of the integrators 300, 305, 310, 315, the feedback DACs 325, the quantizer 320, the addition function 330, and the combination unit 340 are synchronized with the timing signals 950.

In various embodiments, the integration process described above may be performed any number of times and selected based on the particular application. For example, some applications may require a fourth-order delta sigma modulator, having first, second, third, and fourth-stage integrators. Additionally, the analog-to-digital conversion process may be repeated any number of times and may be suited to a particular application or system specification.

In various embodiments, the timing signals 950 corresponding to the first phase ϕ1 and the second phase ϕ2 may have a slight delay between a falling edge of the first phase ϕ1 timing signal and a rising edge of the second phase ϕ2 timing signal. Specifically, the first and second phases ϕ1, ϕ2 of the timing signals 950 may be offset by 180 degrees and may have the same frequency.

Referring again to FIG. 4, after a final integration, for example in this case the final integrator will be the fourth-stage integrator 315, the output voltage may be transmitted to the quantizer 320, where the quantizer 320 represents the analog signal as a digital signal. The digital signal may then be transmitted to the digital circuit 205 for further processing. In an exemplary embodiment, the digital signal may also be transmitted to the feedback DAC 325.

Referring back to FIGS. 8A-8C, in various embodiments, the timing signals controlling each of the sampling capacitors C1(1)(a), C1(1)(b), C1(2)(a), C1(2)(b) may be selected for a particular application. For example, referring to FIG. 8B, each of the first-stage integrators 300(1), 300(2) are operable as two (2) positive-phase integrators, wherein the sampling capacitors C1(1)(a), C1(1)(b), C1(2)(a), C1(2)(b) sample the input voltage simultaneously during the first phase φ1. In an alternative embodiment, referring to FIG. 8C, the first first-stage integrator 300(1) is operable as the positive-phase integrator, wherein the sampling capacitors C1(1)(a), C1(1)(b) sampling the input voltage during the first phase φ1, and the second first-stage integrator 300(2) is operable as the negative-phase integrator, wherein the sampling capacitors C1(2)(a), C1(2)(b) sample the input voltage during an opposite phase, in this case the second phase φ2.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

While the technology has been described with reference to specific exemplary embodiments, various modifications and changes may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A delta-sigma modulator with an output terminal, comprising:
    at least two first-stage integrators connected in parallel;
    a second-stage integrator connected in series with the first-stage integrators, wherein the second-stage integrator is coupled between the at least two first-stage integrators and the output terminal; and
    at least two feedback circuits, wherein each feedback circuit is coupled between the output terminal and an input terminal of one of the first-stage integrators.

2. The delta-sigma modulator of claim 1, wherein:
    each feedback circuit comprises a digital-to-analog converter; and
    a first digital-to-analog converter is coupled between the output terminal and an input of a first first-stage integrator and a second digital-to-analog converter is coupled between the output terminal and an input of a second first-stage integrator.

3. The delta-sigma modulator of claim 2, wherein each of the digital-to-analog converters comprises a capacitor having a capacitance value, and wherein the capacitance value of the first digital-to-analog converter is substantially equal to the capacitance value of the second digital-to-analog converter.

4. The delta-sigma modulator of claim 1, further comprising a summer circuit configured to sum outputs of the at least two first-stage integrators.

5. The delta-sigma modulator of claim 1, further comprising a combination unit coupled to output terminals of the at least two first-stage integrators and the second-stage integrator, and configured to sum output signals of the at least two first-stage integrators and the second-stage integrator.

6. The delta-sigma modulator of claim 1, further comprising a quantizer coupled to an output terminal of the second-stage integrator, wherein a quantizer output terminal is coupled to output terminal of the delta-sigma modulator.

7. The delta-sigma modulator of claim 1, wherein:
    each first-stage integrator comprises at least one of each of a capacitor, a switching device, and an operational amplifier; and
    the capacitors of the first-stage integrators have capacitance values that are substantially equal to each other, the switching devices of the first-stage integrators are substantially equal in size, and the op-amps of the first-stage integrators have substantially equal topology and size.

8. A method for operating a delta-sigma modulator with an increased signal-to-noise ratio comprising:
    receiving an input signal by a first first-stage integrator and a second first-stage integrator, wherein the first and second first-stage integrators are connected in parallel;
    simultaneously integrating the input signal by first and second first-stage integrators; and
    transmitting a first output signal to a second-stage integrator connected in series with the first and second first-stage integrators.

9. The method of claim 8, further comprising summing an output of the first first-stage integrator output with an output of the second first-stage integrator.

10. The method of claim 8, further comprising transmitting a second output signal from an output terminal of the delta-sigma modulator to a first digital-to-analog converter and a second digital-to-analog converter, wherein the first and second digital-to-analog converters are responsive to the second output signal.

11. The method of claim 10, further comprising transmitting:
an output of the first digital-to-analog converter to the first first-stage integrator; and
an output of the second digital-to-analog converter to the second first-stage integrator.

12. The method of claim 8, further comprising:
summing outputs of:
the first first-stage integrator, the second first-stage integrator, and the second quantizing a sum of outputs; and
quantizing the sum.

13. A system, comprising:
a micro electro-mechanical device;
a delta-sigma modulator coupled to the micro electro-mechanical device, comprising:
at least first and second first-stage integrators connected in parallel;
a second-stage integrator connected in series with the first-stage integrators;
a first feedback circuit coupled between an output of the delta-sigma modulator and an input of the first first-stage integrator; and
a second feedback circuit coupled between the output of the delta-sigma modulator and an input of the second first-stage integrator; and
a digital circuit coupled to the output of the delta-sigma modulator.

14. The system of claim 13, wherein:
the first feedback circuit comprises a first digital-to-analog converter;
an input of the first digital-to-analog converter is coupled to the output of the delta-sigma modulator and an output of the first digital-to-analog converter is coupled to the input of the first first-stage integrator.

15. The system of claim 14, wherein:
the second feedback circuit comprises a second digital-to-analog converter;
an input of the second digital-to-analog converter is coupled to the output of the delta-sigma modulator and an output of the second digital-to-analog converter is coupled to the input of the second first-stage integrator.

16. The system of claim 13, further comprising a combination unit coupled to output terminals of the first and second first-stage integrators and the second-stage integrator, wherein the combination unit is configured to sum output signals of the first and second first-stage integrators and the second-stage integrator.

17. The system of claim 13, further comprising a summer circuit coupled to an output terminal of the first first-stage integrator and an output terminal of the second first-stage integrator.

18. The system of claim 13, further comprising a quantizer coupled to an output terminal of the second-stage integrator, wherein a quantizer output terminal is coupled to output terminal of the delta-sigma modulator.

19. The system of claim 13, wherein:
each first-stage integrator comprises at least one of each of a capacitor, a switching device, and an operational amplifier; and
the capacitors of the first-stage integrators have capacitance values that are substantially equal to each other, the switching devices of the first-stage integrators are substantially equal in size, and the op-amps of the first-stage integrators have substantially equal topology and size.

20. The system of claim 13, wherein each of the digital-to-analog converters comprises a capacitor having a capacitance value, and wherein the capacitance value of the first digital-to-analog converter is substantially equal to the capacitance value of the second digital-to-analog converter.

* * * * *